United States Patent
Watanabe et al.

(10) Patent No.: US 7,209,849 B1
(45) Date of Patent: Apr. 24, 2007

(54) TEST SYSTEM, ADDED APPARATUS, AND TEST METHOD

(75) Inventors: Yuya Watanabe, Tokyo (JP); Shigeru Sugamori, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/393,379

(22) Filed: Mar. 30, 2006

(30) Foreign Application Priority Data

Feb. 27, 2006 (JP) .............................. 2006-049908

(51) Int. Cl.
*G01R 31/28* (2006.01)
(52) U.S. Cl. .................. 702/108; 702/31; 702/119; 702/120; 702/187; 714/724; 714/738; 714/739; 714/741; 716/4; 324/756; 324/757; 324/770
(58) Field of Classification Search .............. 702/31, 702/119, 120, 108, 187; 714/724, 738, 739, 714/741; 324/756, 757, 770; 716/4
See application file for complete search history.

(56) References Cited

U.S. PATENT DOCUMENTS

| | | | | |
|---|---|---|---|---|
| 6,080,203 | A * | 6/2000 | Njinda et al. | 716/4 |
| 6,101,622 | A * | 8/2000 | Lesmeister | 714/724 |
| 6,158,031 | A * | 12/2000 | Mack et al. | 714/724 |
| 6,182,858 | B1 * | 2/2001 | Hartog | 221/63 |
| 6,347,388 | B1 * | 2/2002 | Hollander | 714/739 |
| 6,530,054 | B2 * | 3/2003 | Hollander | 714/739 |
| 2002/0073375 | A1 * | 6/2002 | Hollander | 714/739 |
| 2003/0093737 | A1 * | 5/2003 | Purtell et al. | 714/738 |
| 2005/0039079 | A1 * | 2/2005 | Higashi et al. | 714/28 |
| 2006/0052965 | A1 * | 3/2006 | Nodwell | 702/119 |

FOREIGN PATENT DOCUMENTS

| | | |
|---|---|---|
| JP | 8-278988 | 10/1996 |
| JP | 2001-67395 | 3/2001 |
| JP | 2001067395 A * | 3/2001 |

OTHER PUBLICATIONS

Patent Abstracts of Japan, Publication No. 2001-067395, Publication Date: Mar. 16, 2001, 1 page.
Patent Abstracts of Japan, Publication No. 08-278988, Publication Date: Oct. 22, 1996, 1 page.

* cited by examiner

*Primary Examiner*—Carol S. W. Tsai
(74) *Attorney, Agent, or Firm*—Osha-Liang LLP (57) ABSTRACT

There is provided a test system that tests a device under test. The test system includes a test apparatus that tests the device under test on the basis of an event, and an added apparatus that is added between the device under test and the test apparatus when an interval to which a device output signal is changed is smaller than an interval capable of being processed by the test apparatus, and the added apparatus includes a signal input section that inputs the device output signal output from the device under test according to the device input signal, a change detecting section that detects whether the input device output signal has been changed or not, a change timing detecting section that detects the change timing for the device output signal, a storing section that sequentially stores the change timing and the signal value after the change for the device output signal as an output event, according to the fact that the device output signal has been changed, and a reading section that sequentially reads the output events from the storing section to input the events into the test apparatus.

11 Claims, 5 Drawing Sheets

TEST SYSTEM, ADDED APPARATUS, AND TEST METHOD

CROSS REFERENCE TO RELATED APPLICATION

The present application claims priority from a Japanese Patent Application No. 2006-049908 filed on Feb. 27, 2006, the contents of which are incorporated herein by reference.

BACKGROUND OF THE INVENTION

1. Field of the Invention

The present invention relates to a test system, an added apparatus, and a test method. More particularly, the present invention relates to a test system that tests a device under test based on event data made as a result of a logic simulation, an added apparatus, and a test method.

2. Related Art

Conventionally, an event-driven test apparatus has been known as disclosed, for example, in Japanese Patent Application Publication No. 2001-67395. The event-driven test apparatus generates a test signal based on event data including a plurality of sets of a change timing and a signal value after the change for an input signal of a device under test (DUT), and tests the device under test (DUT). The event data can be obtained by performing a logic simulation on design data of the DUT by means of a logic simulator, for example, as disclosed in Japanese Patent Application Publication No. 1996-278988. According to the event-driven test apparatus, since a test pattern may not be directly made, preparation effort for the test pattern can be reduced.

However, since the conventional event-driven test apparatus converts an output signal of the DUT into event data and checks the converted data with an event to be an expected value, a constant time is required for the converting and checking process. Therefore, it becomes expensive for realizing a high-speed test apparatus.

SUMMARY OF THE INVENTION

Therefore, it is an object of the present invention to provide a test system, an added apparatus, and a test method that can solve the foregoing problems. The above and other objects can be achieved by combinations described in the independent claims. The dependent claims define further advantageous and exemplary combinations of the present invention.

That is, according to the first aspect of the present invention, there is provided a test system that tests a device under test. The test system includes: an event data acquiring section that acquires event data including a plurality of sets of a change timing and a signal value after the change for each of a device input signal input into the device under test and a device output signal output from the device under test, which are obtained by a logic simulation for the device under test; a signal generating section that generates the device input signal to be supplied to the device under test based on the input event including the change timing and the signal value after the change for the device input signal, which are included in the event data; a signal supplying section that supplies the generated device input signal to the device under test; a signal input section that inputs the device output signal output from the device under test according to the device input signal; a change detecting section that detects whether the input device output signal has been changed or not; a change timing detecting section that detects the change timing for the device output signal; a storing section that sequentially stores the change timing and the signal value after the change for the device output signal as an output event, according to the fact that the device output signal has been changed; a reading section that sequentially reads the output event from said storing section; and a quality deciding section that checks an event, which includes the change timing and the signal value after the change for the device output signal to be output from the device under test and is obtained by a logic simulation for the device under test, as an expected value event with the read output event, in order to decide whether the device output signal is identical with the expected value or not.

The storing section may include: a buffer storing section that is realized by a register or a memory and sequentially buffers the output events; and a file storing section that sequentially calls out the output events from the buffer storing section to store them as a file. The reading section may start reading the output event from said storing section after said signal supplying section finishes supplying the device input signal based on the event data.

The test system may further include: a converting section that inputs the device output signal output from the device under test and converts the device output signal to the output event including the change timing and the signal value after the change for the device output signal; and a selecting section that outputs the previously designated output event between the output event converted by said converting section and the output event read by said reading section. The selecting section may select and output the output event read by said reading section when an interval by which the device output signal changes is smaller than an interval capable of being processed by said converting section and said quality deciding section.

The test system may further include a match deciding section that decides whether the device output signal is a predetermined trigger signal value or not, and the storing section may start storing the output event according to the fact that the device output signal has been identical with the trigger signal value. The test system may further include: a counter that is incremented every predetermined reference clock; a measuring section that measures a misaligned amount of change timing of the device output signal for an edge of the reference clock; and a change timing outputting section that outputs a set of the value of said counter and the misaligned amount measured by said measuring section as the change timing at the timing at which the device output signal is changed.

The device output signal may be a signal consisting of plural bits, the test system may further include: a plurality of probes that touches a plurality of terminals outputting the device output signal in the device under test; and an error measuring section that measures an error every bit from when a signal is output from the device under test to said plurality of probes to when said change detecting section detects the change of corresponding bit, and the change timing outputting section may add a correction value for correcting the error measured by said error measuring section to a value of the counter corresponding to each bit and the misaligned amount measured by said measuring section.

To solve the problem, according to the second aspect of the present invention, there is provided a test system that tests a device under test. The test system includes: a test apparatus that tests the device under test on the basis of an event; and an added apparatus that is added between the device under test and said test apparatus when an interval to which a device output signal output from the device under test is changed is smaller than an interval capable of being processed by said test apparatus. The test apparatus includes: an event data acquiring section that acquires event data including a plurality of sets of a change timing and a signal value after the change for each of a device input signal input into the device under test and a device output signal output from the device under test; a signal generating section that generates the device input signal to be supplied to the device under test based on the input event including the change timing and the signal value after the change for the device input signal, which are included in the event data; a signal supplying section that supplies the generated device input signal to the device under test; a converting section that inputs the device output signal output from the device under test and converts the device output signal into the output event including the change timing and the signal value after the change for the device output signal; a selecting section that outputs the previously selected output event between the output event converted by said converting section and the output event input from an outside; and a quality deciding section that checks, in parallel with the signal supply to the device under test, an event, which includes the change timing and the signal value after the change for the device output signal to be output from the device under test, as an expected value event with the output event output from said selecting section, in order to decide whether the device output signal is identical with the expected value or not, and the added apparatus includes: a signal input section that inputs the device output signal output from the device under test according to the device input signal; a change detecting section that detects whether the input device output signal has been changed or not; a change timing detecting section that detects the change timing for the device output signal; a storing section that sequentially stores the change timing and the signal value after the change for the device output signal as an output event, according to the fact that the device output signal has been changed; and a reading section that sequentially reads the output events from said storing section to input the events into said test apparatus.

To solve the problem, according to the third aspect of the present invention, there is provided an added apparatus that is added to a test apparatus for testing a device under test on the basis of an event. The test apparatus includes: an event data acquiring section that acquires event data including a plurality of sets of a change timing and a signal value after the change for each of a device input signal input into the device under test and a device output signal output from the device under test; a signal generating section that generates the device input signal to be supplied to the device under test based on the input event including the change timing and the signal value after the change for the device input signal, which are included in the event data; a signal supplying section that supplies the generated device input signal to the device under test; a converting section that inputs the device output signal output from the device under test and converts the device output signal into the output event including the change timing and the signal value after the change for the device output signal; a selecting section that outputs the previously selected output event between the output event converted by said converting section and the output event input from an outside; and a quality deciding section that checks, in parallel with the signal supply to the device under test, an event, which includes the change timing and the signal value after the change for the device output signal to be output from the device under test, as an expected value event with the output event output from said selecting section, in order to decide whether the device output signal is identical with the expected value or not. The added apparatus is added between the device under test and the test apparatus when an interval to which the device output signal is changed is smaller than an interval capable of being processed by the test apparatus. The added apparatus includes: a signal input section that inputs the device output signal output from the device under test according to the device input signal; a change detecting section that detects whether the input device output signal has been changed or not; a change timing detecting section that detects the change timing for the device output signal; a storing section that sequentially stores the change timing and the signal value after the change for the device output signal as an output event, according to the fact that the device output signal has been changed; and a reading section that sequentially reads the output events from said storing section to input the events into said test apparatus.

To solve the problem, according to the fourth aspect of the present invention, there is provided a test method for testing a device under test by means of a test system. The test method includes: an event data acquiring step of acquiring event data including a plurality of sets of a change timing and a signal value after the change for each of a device input signal input into the device under test and a device output signal output from the device under test, which are obtained by a logic simulation for the device under test; a signal generating step of generating the device input signal to be supplied to the device under test based on the input event including the change timing and the signal value after the change for the device input signal, which are included in the event data; a signal supplying step of supplying the generated device input signal to the device under test; a signal input step of inputting the device output signal output from the device under test according to the device input signal; a change detecting step of detecting whether the input device output signal has been changed or not; a change timing detecting step of detecting the change timing for the device output signal; a storing step of sequentially storing the change timing and the signal value after the change for the device output signal as an output event, according to the fact that the device output signal has been changed; a reading step of sequentially reading the output event stored in said storing step; and a quality deciding step of checking an event, which includes the change timing and the signal value after the change for the device output signal to be output from the device under test and is obtained by a logic simulation for the device under test, as an expected value event with the read output event, in order to decide whether the device output signal is identical with the expected value or not.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
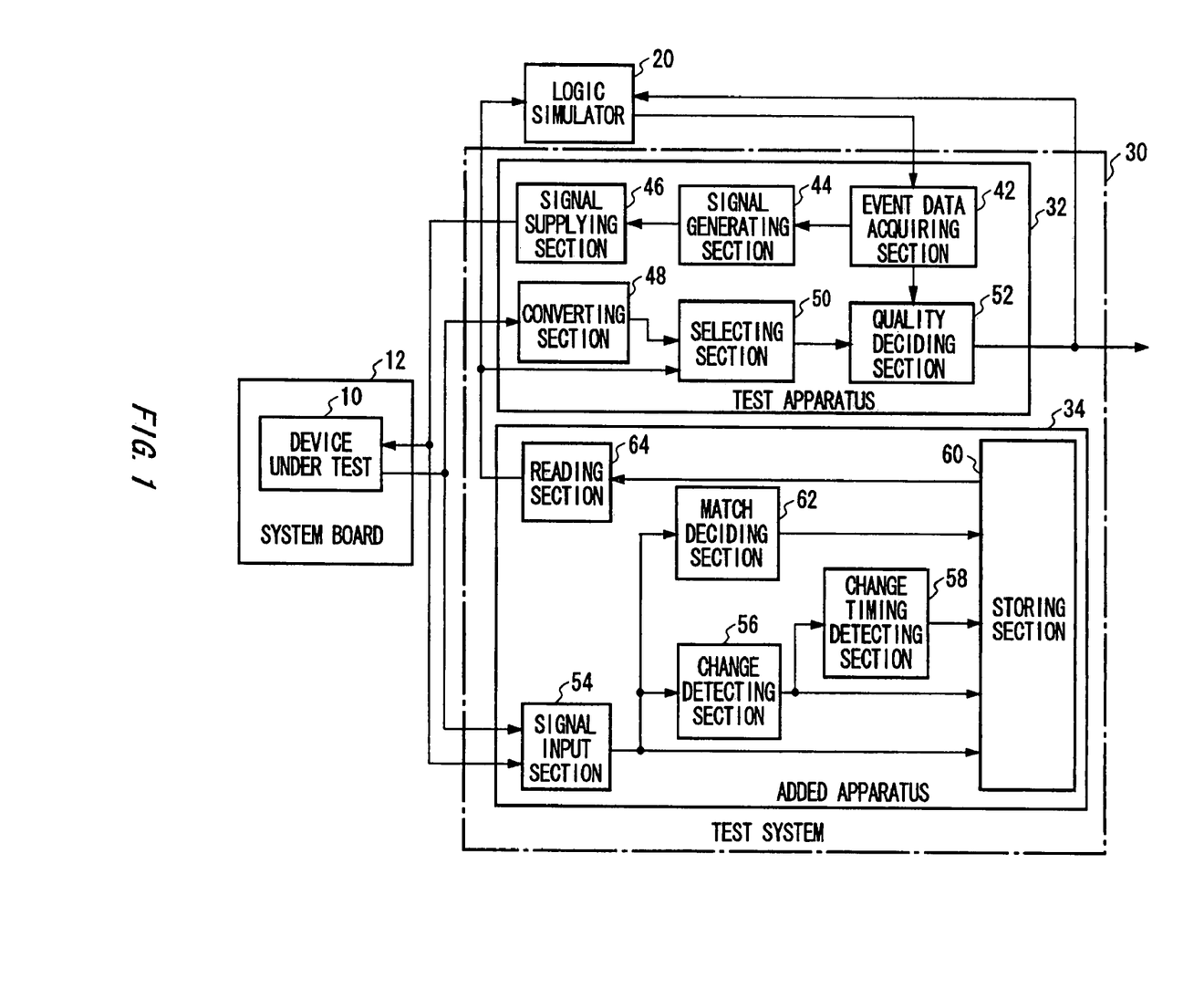
FIG. 1 is a view showing a configuration of a test system according to an embodiment of the present invention along with a device under test, a system board, and a logic simulator.

FIG. 1 is a view showing a configuration of a test system 30 according to the present embodiment along with a device under test 10, a system board 12, and a logic simulator 20. The device under test 10 mounts thereon a logic circuit to be an object under test. The device under test 10 may be mounted on the system board 12 on which a peripheral circuit is arranged, in order to be tested in a state where the device operates along with the peripheral circuit. In this way, it is possible to detect an error generated by operating the device under test 10 and the peripheral circuit together. In addition, the system board 12 may be the same form as an actually used apparatus. Alternatively, the device under test 10 may also be mounted on a performance board that is a substrate for test to be tested. In this way, it is possible to detect an error generated by singly operating the device under test 10.

The logic simulator 20 logically simulates design data of the device under test 10. As a result of the logic simulation for the device under test 10, the logic simulator 20 can obtain event data including a plurality of sets of a change timing and a signal value after the change for each of a device input signal input into the device under test 10 and a device output signal output from the device under test 10.

The test system 30 tests the device under test 10. The test system 30 includes a test apparatus 32 and an added apparatus 34.

The test apparatus 32 tests the device under test 10 on the basis of an event. That is, the test apparatus 32 generates a test signal based on event data to supply it to the device under test 10, acquires an output signal according to the supplied test signal from the device under test 10, and converts the acquired output signal into the event data to check it with an expected value event. According to the test apparatus 32 for testing devices on the basis of an event, the device under test 10 can be tested without a user directly making test patterns.

The test apparatus 32 has an event data acquiring section 42, a signal generating section 44, a signal supplying section 46, a converting section 48, a selecting section 50, and a quality deciding section 52. The event data acquiring section 42 acquires the event data obtained by performing the logic simulation on the device under test 10 from the logic simulator 20. More specifically, the event data acquiring section 42 acquires an input event, which includes a change timing and a signal value after the change for the device input signal to be input to the device under test 10 as a test signal, from the logic simulator 20. Furthermore, the event data acquiring section 42 acquires an event, which includes a change timing and a signal value after the change for the device output signal to be output from the device under test 10 according to the device input signal, as an expected value event from the logic simulator 20.

The signal generating section 44 forms a signal waveform based on the input event included in the event data acquired by the event data acquiring section 42 to generate the device input signal to be supplied to the device under test 10. The signal supplying section 46 supplies the device input signal generated by the signal generating section 44 to the device under test 10. The converting section 48 inputs the device output signal output from the device under test 10 according to the supply of the device input signal. Then, the converting section 48 converts the input signal into an output event including a change timing and a signal value after the change for the device output signal.

The selecting section 50 inputs an output event from the signal supplying section 46 and an outside. More specifically, the selecting section 50 inputs the output event from the signal supplying section 46 and the added apparatus 34. The selecting section 50 outputs a previously selected output event between the output event converted by the converting section 48 and the output event input from the outside. As an example, when an interval by which the device output signal input from the device under test 10 is changed is smaller than an interval capable of being processed by the converting section 48 and the quality deciding section 52, the selecting section 50 selects and outputs the output event input from the added apparatus 34.

For example, when the interval by which the device output signal is changed is shorter than a processing time spent by the converting section 48 and the quality deciding section 52, the selecting section 50 selects and outputs the output event output from the added apparatus 34. Moreover, for example, when a time interval of the output event to be output from the device under test 10, with reference to the event data acquired by the event data acquiring section 42, is equal to or less than a specified value, the selecting section 50 may select and output the output event input from the added apparatus 34.

In parallel with a signal supply to the device under test 10, the quality deciding section 52 checks the event, which includes the change timing and the signal value after the change for the device output signal to be output from the device under test 10, as an expected value event with the output event output from the selecting section 50, in order to decide whether the device output signal is identical with an expected value or not. That is, the quality deciding section 52 checks the output event input through the selecting section 50 with the expected value event acquired by the event data acquiring section 42 to decide the good or bad of the device under test 10.

When the quality deciding section 52 detects an error because the output event is different from the expected value event, the different output event may be supplied to the logic simulator 20. In this way, the logic simulator 20 can modify defect on design data with reference to the test result for the device under test 10. Furthermore, the logic simulator 20 can backward trace a logic circuit outputting the error to detect the logic circuit that causes the output of the different data.

When the interval by which the device output signal is changed is smaller than an interval capable of being processed by the test apparatus 32, the added apparatus 34 is added between the device under test 10 and the test apparatus 32. As an example, the added apparatus 34 may be added by being connected with a signal line between the test apparatus 32 and the device under test 10, by being mechanically mounted on the test apparatus 32, or by being switched by an automatic or manual selector in a previously integrated fashion with the test apparatus 32.

The added apparatus 34 has a signal input section 54, a change detecting section 56, a change timing detecting section 58, a storing section 60, a match deciding section 62, and a reading section 64. The signal input section 54 inputs the device output signal output from the device under test 10 according to the device input signal, and also inputs the device input signal output from the signal supplying section 46. Hereinafter, in case of showing two signals of the device output signal and the device input signal that are input by the signal input section 54, they are referred to as device input/output signals. In addition, the signal input section 54 may input only the device output signal.

The change detecting section 56 detects whether the device input/output signals input by the signal input section 54 have been changed or not. If the device input/output signals are two-level signals, the change detecting section 56 detects a change from zero to one and a change from one to zero in the device input/output signals.

The change timing detecting section 58 detects change timings of the device input/output signals input by the signal input section 54. As an example, the change timing detecting section 58 may detect a change timing shown by elapsed time from a reference time instant to a corresponding point of variation or a change timing shown by a time difference from a just precedent point of variation to a corresponding point of variation.

The storing section 60 sequentially stores sets of change timings and signal values after the changes for the device input/output signals as an input event and an output event according to the changes of the device input/output signals. Hereinafter, in case of showing two events of the input event and the output event stored on the storing section 60, they are referred to as input-output events. In addition, the storing section 60 may store only the output event.

Moreover, the storing section 60 may make a plurality of input-output events as a file and store them. In this way, the storing section 60 can store a large number of input-output events.

The match deciding section 62 decides whether the device input/output signals are predetermined trigger signal values or not. The storing section 60 may start storing the input-output events according to the fact that the device input/output signals are identical with the trigger signal value. Alternatively or additionally, the storing section 60 may terminate storing the input-output events according to the fact that the device input/output signals are identical with the trigger signal value. In this way, the storing section 60 can narrow down the output event to an object for the good or bad decision to store it.

The reading section 64 sequentially reads the output events from the storing section 60 and sequentially inputs the read output events into the test apparatus 32. As an example, after the signal supplying section 46 finishes supplying the device input signal based on the event data, the reading section 64 may start reading the output event from the storing section 60. Moreover, the reading section 64 may read the input-output events from the storing section 60 and input them into the logic simulator 20. In this way, the design data can be modified with reference to the input-output events generated from the device under test 10.

In addition, when the device input/output signals are consisted of a plurality of bits, the added apparatus 34 may have a plurality of the signal input section 54, the change detecting section 56, and the change timing detecting section 58 in correspondence with a signal for each bit. Moreover, when the device input/output signals are consisted of a plurality of bits, the added apparatus 34 may have the signal input section 54, the change detecting section 56, and the change timing detecting section 58 every group of a plurality of bits.

According to this test system 30, the test apparatus 32 generates the device input signal based on the input event to supply it to the device under test 10. Then, the test apparatus 32 converts the device output signal output from the device under test 10 according to the device input signal into the output event, and decides the good or bad by checking the converted output event with the expected value event. In this way, according to the test system 30, the device under test 10 can be tested on the basis of an event.

Furthermore, according to the test system 30, when an interval by which the device output signal is changed is smaller than an interval capable of being processed by the test apparatus 32, the added apparatus 34 is added between the device under test 10 and the test apparatus 32. The added apparatus 34 converts the device output signals output from the device under test 10 into the output events to sequentially store them on the storing section 60. The added apparatus 34 sequentially reads the output events stored on the storing section 60 to input them into the test apparatus 32. Then, the test apparatus 32 checks the output event input from the added apparatus 34 with the expected value event to decide the good or bad.

In this way, according to the test system 30, although an interval by which the device output signal is changed is smaller than an interval capable of being processed by the test apparatus 32, an efficient test can be done without delaying the speed of the device output signal. Therefore, according to the test system 30, a test time can be shortened. Furthermore, according to the test system 30, since the output event of the device under test 10 is stored on the storing section 60, a large number of test results can be stored. Therefore, although an error with low frequency of occurrence is generated, a cause of the error can be easily analyzed by referring to the stored output event.

Figure 2:
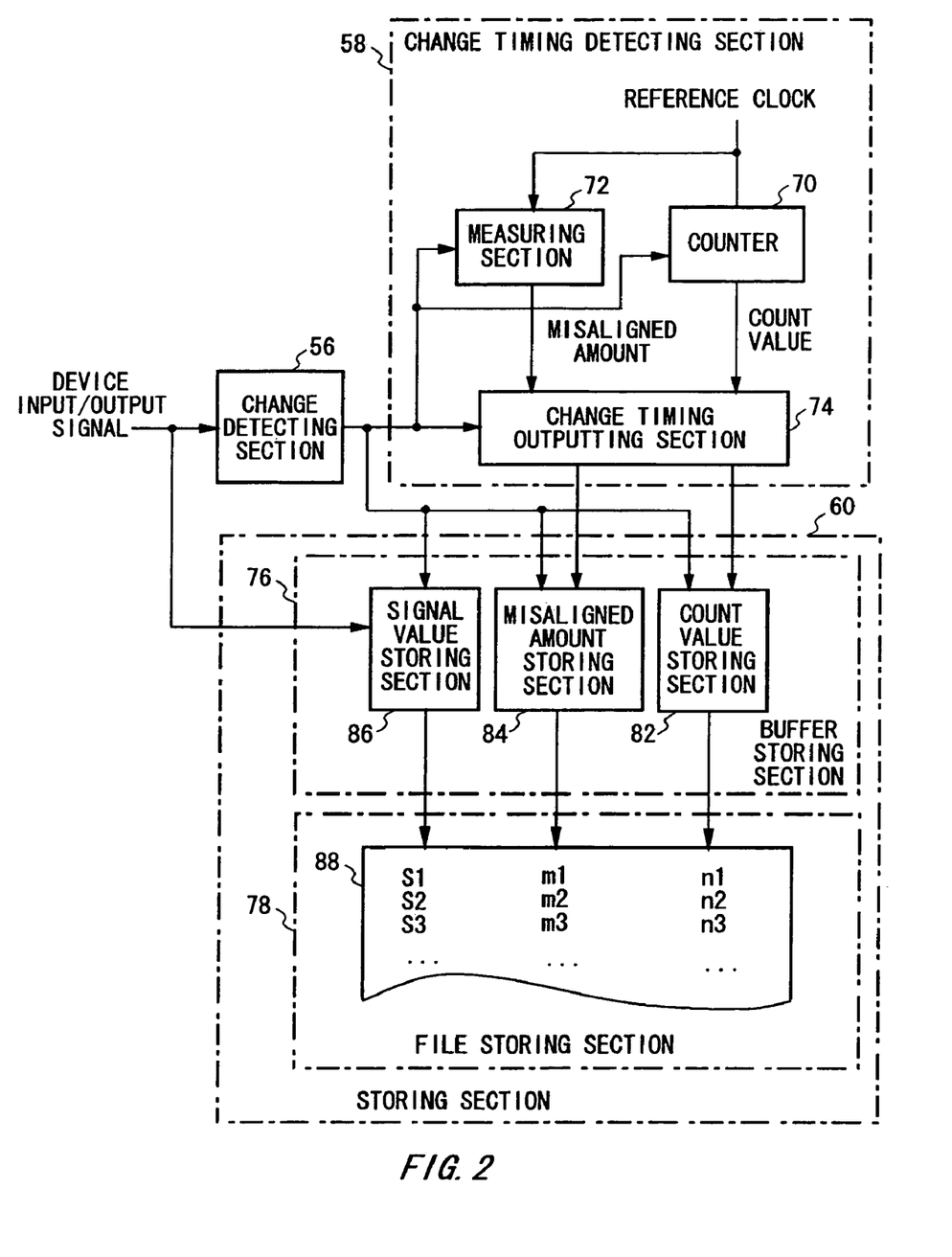
FIG. 2 is a view exemplary showing a configuration of a change timing detecting section and a storing section according to an embodiment of the present invention along with a change detecting section.

FIG. 2 is a view exemplary showing a configuration of the change timing detecting section 58 and the storing section 60 according to the present embodiment, along with the change detecting section 56. The change timing detecting section 58 may include a counter 70, a measuring section 72, and a change timing outputting section 74. The counter 70 increments an internally stored count value every predetermined reference clock. As an example, the counter 70 may reset the count value stored therein at a reference time instant such as a start time instant, and then continue to increment without reset, or reset the count value stored therein whenever the device input/output signals are changed.

The measuring section 72 measures the misaligned amount of the change timing of the device input/output signals with respect to an edge of a reference clock. As an example, the measuring section 72 may measure a time difference between the edge of the reference clock generated just before the time point at which the device input/output signals have been changed and the changed time point to a less accuracy than a period of the reference clock, and output the measured value as the misaligned amount.

The change timing outputting section 74 outputs a set of a value of the counter 70 and the misaligned amount measured by the measuring section 72, at a timing at which the device input/output signals are changed, as a change timing. As an example, the change timing outputting section 74 may respectively acquire the misaligned amount detected by the measuring section 72 at the timing at which the device input/output signals are changed and the count value of the change timing outputting section 74 at the timing, and output the acquired misaligned amount and the count value as a set. According to this change timing detecting section 58, although a change interval of the device input/output signals is short, a change timing can be detected.

The storing section 60 may include a buffer storing section 76 and a file storing section 78. The buffer storing section 76 is realized by a register or a memory and sequentially buffers the input-output events. As an example, the buffer storing section 76 may have a count value storing section 82, a misaligned amount storing section 84, and a signal value storing section 86 that are respectively realized by a register or a memory.

The signal value storing section 86 acquires and stores the count value at the timing at which the device input/output signals are changed from the change timing outputting section 74. The misaligned amount storing section 84 acquires and stores the misaligned amount at the timing at which the device input/output signals are changed from the change timing outputting section 74. The count value storing section 82 sequentially acquires the signal values next to the changed timing in the device input/output signals. Then, the count value storing section 82, the misaligned amount storing section 84, and the signal value storing section 86 store the count value, the misaligned amount, and the signal value in association with one another as input-output events.

The file storing section 78 sequentially calls out the input-output events from the buffer storing section 76, and converts them into a file 88 in which the plurality of input-output events are described in a predetermined form. Then, the file storing section 78 stores the converted file 88 on a mass-storage device such as a hard disk. In this way, the file storing section 78 can store the input-output events as the file 88.

According to this storing section 60, since an input-output event is buffered by a register or a memory, an output event can be acquired even though a change interval of the device input/output signals is short. Furthermore, according to the storing section 60, a large number of input-output events can be stored because the input-output events are made as a file.

Figure 3:
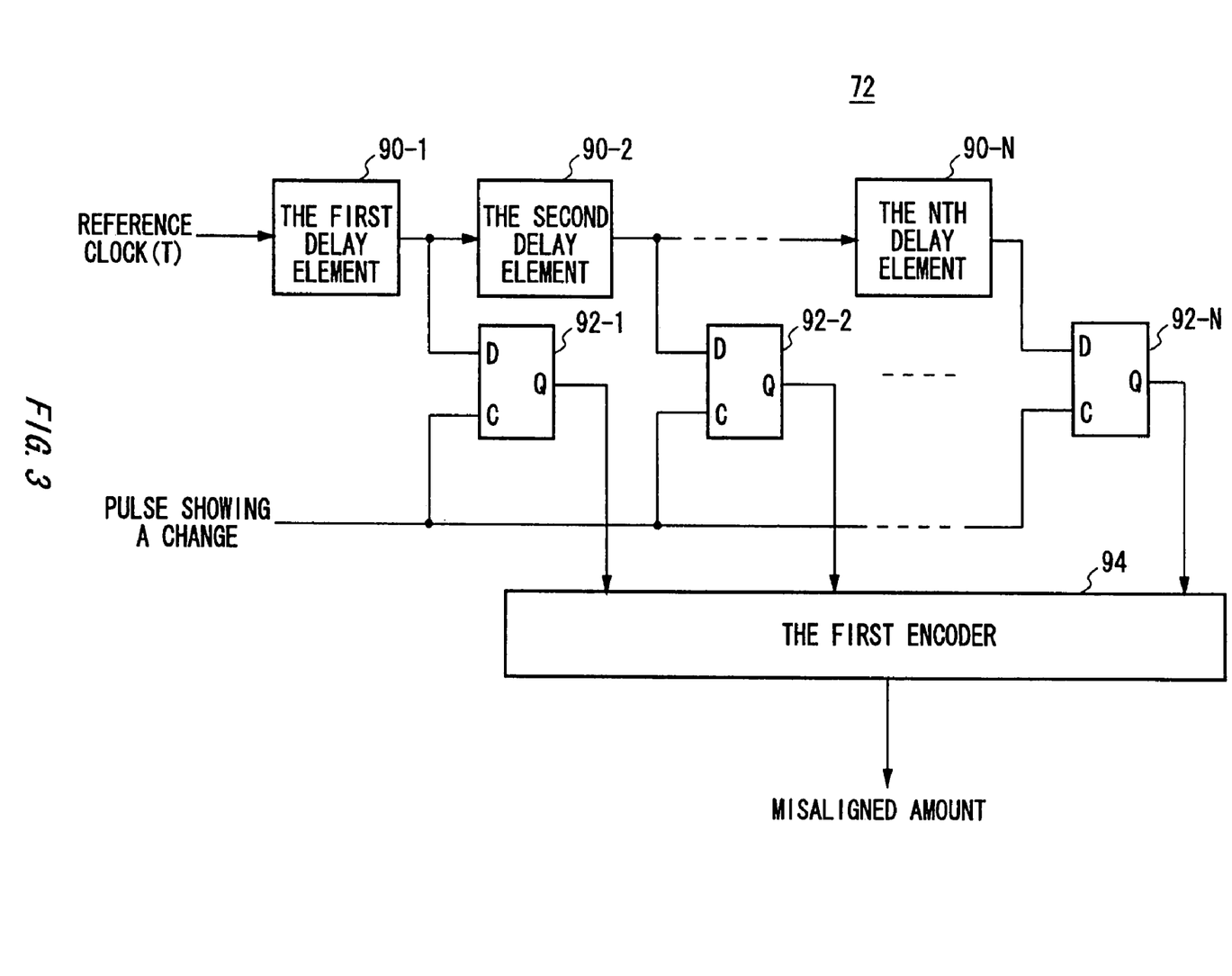
FIG. 3 is a view exemplary showing a configuration of a measuring section.

FIG. 3 is a view exemplary showing a configuration of the measuring section 72. The measuring section 72 may have delay elements 90-1 to 90-N of N pieces (N is an integer number not less than 2) of a first to an Nth, a first to an Nth flip-flops 92-1 to 92-N, and a first encoder 94. The first to the Nth delay elements 90-1 to 90-N are serially connected, and input a reference clock (for example, a period (T)) from the foremost stage. Then, the first to the Nth delay elements 90-1 to 90-N delay the reference clock each input from the elements of previous stages by N/T time, and output the delayed clock to the elements of subsequent stages. In this way, the first to the Nth delay elements 90-1 to 90-N can sequentially transmit an edge of the reference clock to the subsequent stages by N/T time.

The first to the Nth flip-flops 92-1 to 92-N are provided in correspondence with each of the first to the Nth delay elements 90-1 to 90-N. Each of the first to the Nth flip-flops 92-1 to 92-N inputs an output signal of a corresponding delay element 90 into a data input port, and inputs a pulse showing a change of the device input/output signals into a clock port. Then, each of the first to the Nth flip-flops 92-1 to 92-N acquires an output signal of a corresponding delay element 90 at a change timing of the device input/output signals. In this way, the first to the Nth flip-flops 92-1 to 92-N can detect a transmission position of an edge of a reference clock on the first to the Nth delay elements 90-1 to 90-N at a timing at which the device input/output signals are changed.

Based on the values acquired by the first to the Nth flip-flops 92-1 to 92-N, the first encoder 94 computes a time difference between an edge of a reference clock and a point of variation of the device input/output signals, and outputs it as a misaligned amount. More specifically, the first encoder 94 detects the number of stages of the delay elements delayed from a transmission position of an edge of a reference clock at a timing at which the device input/output signals are changed, and converts the detected number of stages into a time difference between the edge of the reference clock and to the change timing of the device input/output signals. Then, the first encoder 94 outputs the converted time difference as a misaligned amount.

According to the measuring section 72 with this configuration, a misaligned amount of the change timing of the device input/output signals with respect to an edge of a reference clock can be measured and output to a less accuracy than a period of the reference clock.

Figure 4:
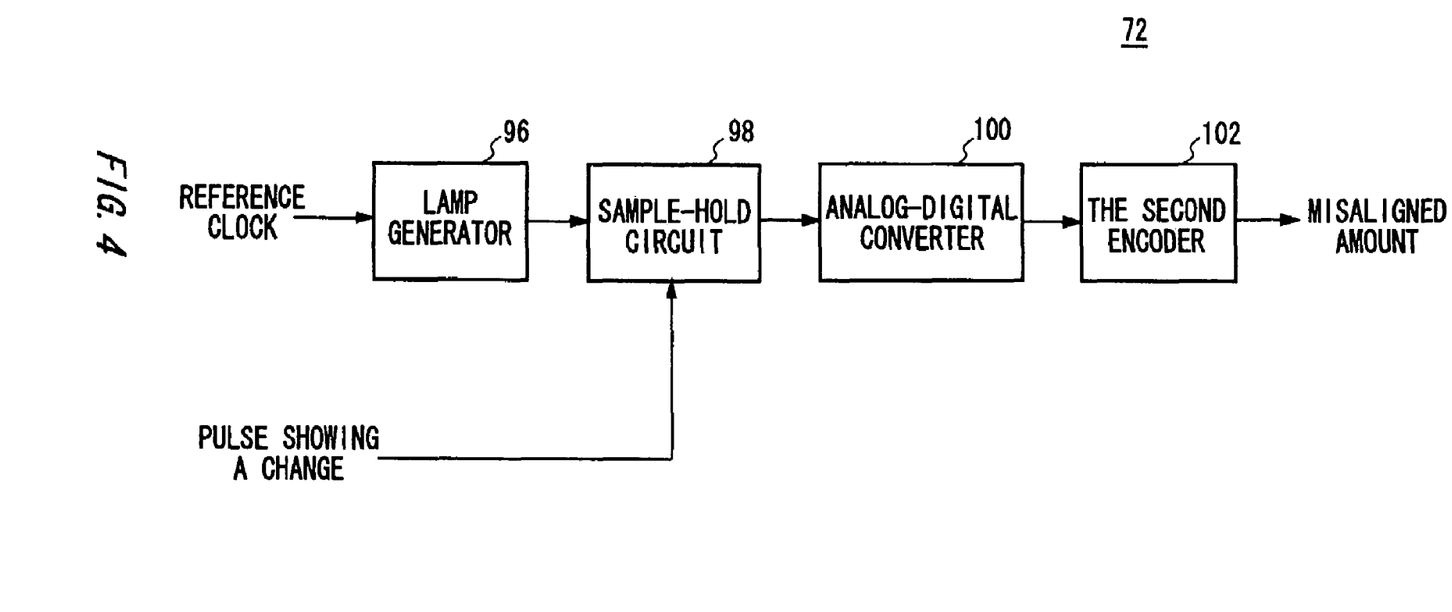
FIG. 4 is a view showing another example of a configuration of a measuring section.

FIG. 4 is a view showing another example of a configuration of a measuring section 72. The measuring section 72 may have a lamp generator 96, a sample-hold circuit 98, an analog-digital converter 100, and a second encoder 102. The lamp generator 96 linearly changes an output voltage at predetermined inclination, and resets the output voltage to an initial value when an edge of a reference clock is input. That is, the lamp generator 96 generates a voltage of a lamp waveform synchronized with the reference clock.

The sample-hold circuit 98 inputs the output voltage from the lamp generator 96. Then, the sample-hold circuit 98 holds the input output voltage at an input timing for a pulse showing a change of the device input/output signals. The analog-digital converter 100 converts the voltage held by the sample-hold circuit 98 into a digital value. In this case, the analog-digital converter 100 converts an analog value into a digital value in sufficiently short time with respect to a period of the reference clock.

The second encoder 102 computes a time difference between an edge of the reference clock and a point of variation of the device input/output signals based on the value converted into the digital value by the analog-digital converter 100, and outputs the computed time difference as a misaligned amount. For example, the second encoder 102 computes a ratio (m/M) of a voltage (m) held at a timing at which the device input/output signals are changed with respect to a voltage (M) changed by the lamp generator 96 for one period of the reference clock (T), and multiplies the computed ratio (m/M) by the time of one period of the reference clock (T). In this way, according to the second encoder 102, it is possible to compute a misaligned amount from an edge of a reference clock just before a point of variation of the device input/output signals to the point of variation.

According to the measuring section 72 with this configuration, a misaligned amount of the change timing of the device input/output signals with respect to an edge of a reference clock can be measured and output to a less accuracy than a period of the reference clock.

Figure 5:
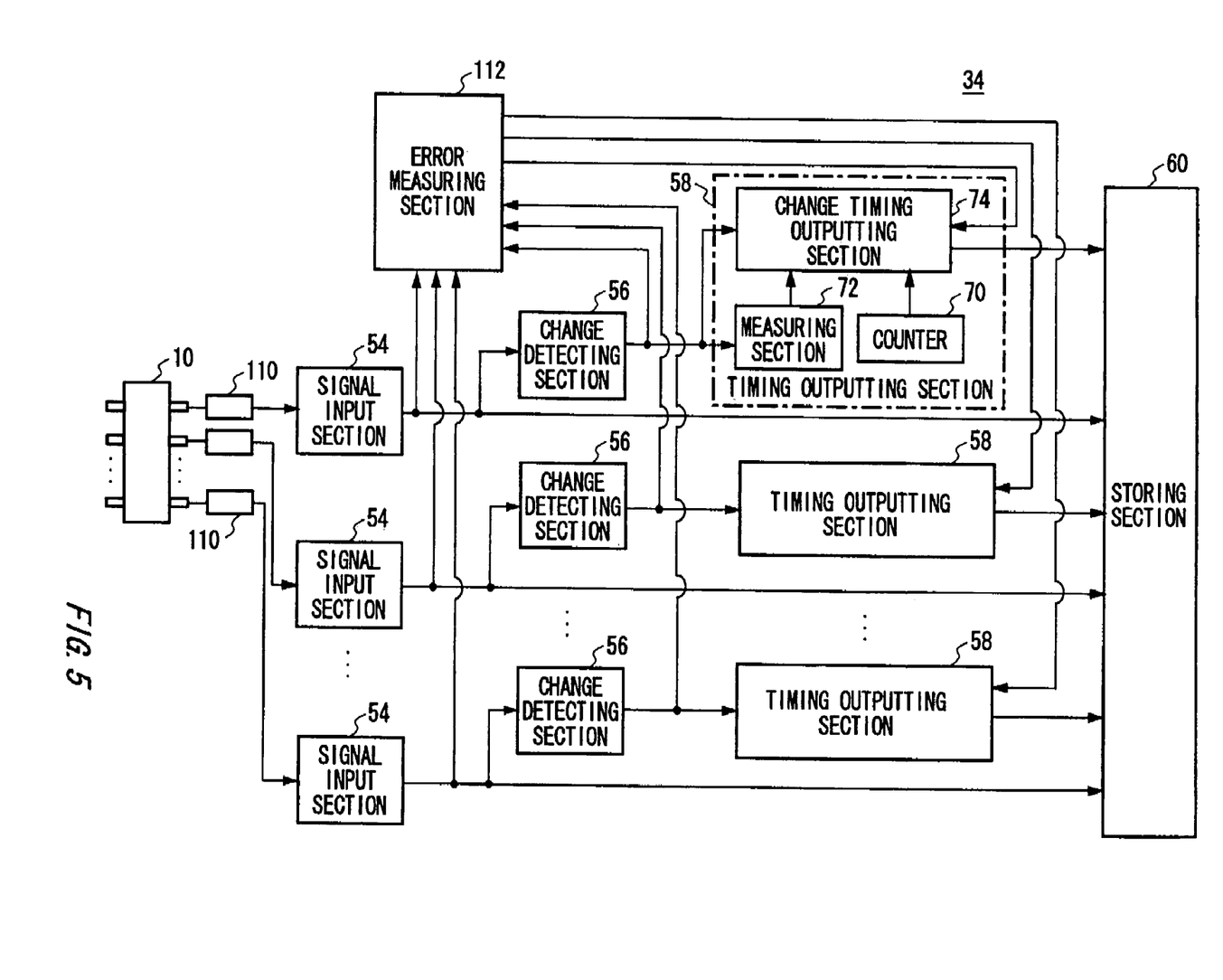
FIG. 5 is a view showing a configuration of an added apparatus according to an alternative example along with a device under test.

FIG. 5 is a view showing a configuration of an added apparatus 34 according to an alternative example of the present embodiment, along with the device under test 10. Since the components of the present alternative example having the same reference numbers as those of FIGS. 1 and 2 have the same or similar functions as or to those of FIGS. 1 and 2, their descriptions will be omitted.

When the device input/output signals are consisted of a plurality of bits, the added apparatus 34 may have the signal input section 54, the change detecting section 56, and the change timing detecting section 58 in correspondence with each signal. Moreover, when the device input/output signals are consisted of a plurality of bits, the added apparatus 34 may further have a probe 110 and an error measuring section 112.

The probe 110 gets in touch with a plurality of terminals outputting the device input/output signals in the device under test 10. The probe 110 detects a signal output from each terminal of the device under test 10. Then, each of the signal input sections 54 inputs an output signal of the device under test 10 via the corresponding the probe 110. The error measuring section 112 measures an error every bit from when a signal is output from the device under test 10 to the plurality of probes 110 to when the change detecting section 56 detects a change of a corresponding bit. As an example, the error measuring section 112 generates an output signal with a temporally equal timing from each terminal of the device under test 10 at an initial setting such as the front of a test start, and detects the output signal from the change detecting section 56. Then, the error measuring section 112 measures an error of signal transmitting time for each bit from the terminal of the device under test 10 to the change detecting section 56.

Then, in the test, the change timing outputting section 74 within the change timing detecting section 58 corresponding to each bit adds a correction value for correcting an error measured by the error measuring section 112 to a value of the counter 70 corresponding to each bit and a misaligned amount measured by the measuring section 72. In this way, according to the added apparatus 34 related to the present alternative example, it is possible to correct an error by a difference of delay amount when the signal for each bit is transmitted. Therefore, according to the added apparatus 34, a generation time of an output event can be accurately generated and stored.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to realize a test system, an added apparatus, and a test method for efficiently performing a test on the basis of an event.

What is claimed is:

1. A test system that tests a device under test, comprising:
   an event data acquiring section that acquires event data including a plurality of sets of a change timing and a signal value after the change for each of a device input signal input into the device under test and a device output signal output from the device under test, which are obtained by a logic simulation for the device under test;
   a signal generating section that generates the device input signal to be supplied to the device under test based on the input event including the change timing and the signal value after the change for the device input signal, which are included in the event data;
   a signal supplying section that supplies the generated device input signal to the device under test;
   a signal input section that inputs the device output signal output from the device under test according to the device input signal;
   a change detecting section that detects whether the input device output signal has been changed or not;
   a change timing detecting section that detects the change timing for the device output signal;
   a storing section that sequentially stores the change timing and the signal value after the change for the device output signal as an output event, according to the fact that the device output signal has been changed;
   a reading section that sequentially reads the output event from said storing section; and
   a quality deciding section that checks an event, which includes the change timing and the signal value after the change for the device output signal to be output from the device under test and is obtained by a logic simulation for the device under test, as an expected value event with the read output event, in order to decide whether the device output signal is identical with the expected value or not.

2. The test system as claimed in claim 1, wherein said storing section comprises:
   a buffer storing section that is realized by a register or a memory and sequentially buffers the output events; and
   a file storing section that sequentially calls out the output events from the buffer storing section to store them as a file.

3. The test system as claimed in claim 1, wherein said reading section starts reading the output event from said storing section after said signal supplying section finishes supplying the device input signal based on the event data.

4. The test system as claimed in claim 1, further comprising:
   a converting section that inputs the device output signal output from the device under test and converts the device output signal to the output event including the change timing and the signal value after the change for the device output signal; and
   a selecting section that outputs the previously designated output event between the output event converted by said converting section and the output event read by said reading section.

5. The test system as claimed in claim 4, wherein said selecting section selects and outputs the output event read by said reading section when an interval by which the device output signal changes is smaller than an interval capable of being processed by said converting section and said quality deciding section.

6. The test system as claimed in claim 1, wherein the test system further comprises a match deciding section that decides whether the device output signal is a predetermined trigger signal value or not, and said storing section starts storing the output event according to the fact that the device output signal has been identical with the trigger signal value.

7. The test system as claimed in claim 1, further comprising:
   a counter that is incremented every predetermined reference clock;
   a measuring section that measures a misaligned amount of change timing of the device output signal for an edge of the reference clock; and
   a change timing outputting section that outputs a set of the value of said counter and the misaligned amount measured by said measuring section as the change timing at the timing at which the device output signal is changed.

8. The test system as claimed in claim 7, wherein the device output signal is a signal consisting of plural bits, the test system further comprises:
   a plurality of probes that touches a plurality of terminals outputting the device output signal in the device under test; and
   an error measuring section that measures an error every bit from when a signal is output from the device under test to said plurality of probes to when said change detecting section detects the change of corresponding bit, and said change timing outputting section adds a correction value for correcting the error measured by said error measuring section to a value of the counter corresponding to each bit and the misaligned amount measured by said measuring section.

9. A test system that tests a device under test, comprising:

a test apparatus that tests the device under test on the basis of an event; and an added apparatus that is added between the device under test and said test apparatus when an interval to which a device output signal output from the device under test is changed is smaller than an interval capable of being processed by said test apparatus, said test apparatus comprising:

an event data acquiring section that acquires event data including a plurality of sets of a change timing and a signal value after the change for each of a device input signal input into the device under test and a device output signal output from the device under test;

a signal generating section that generates the device input signal to be supplied to the device under test based on the input event including the change timing and the signal value after the change for the device input signal, which are included in the event data;

a signal supplying section that supplies the generated device input signal to the device under test;

a converting section that inputs the device output signal output from the device under test and converts the device output signal into the output event including the change timing and the signal value after the change for the device output signal;

a selecting section that outputs the previously selected output event between the output event converted by said converting section and the output event input from an outside; and a quality deciding section that checks, in parallel with the signal supply to the device under test, an event, which includes the change timing and the signal value after the change for the device output signal to be output from the device under test, as an expected value event with the output event output from said selecting section, in order to decide whether the device output signal is identical with the expected value or not, and said added apparatus comprising:

a signal input section that inputs the device output signal output from the device under test according to the device input signal;

a change detecting section that detects whether the input device output signal has been changed or not;

a change timing detecting section that detects the change timing for the device output signal;

a storing section that sequentially stores the change timing and the signal value after the change for the device output signal as an output event, according to the fact that the device output signal has been changed; and a reading section that sequentially reads the output events from said storing section to input the events into said test apparatus.

10. An added apparatus that is added to a test apparatus for testing a device under test on the basis of an event, the test apparatus comprising:

an event data acquiring section that acquires event data including a plurality of sets of a change timing and a signal value after the change for each of a device input signal input into the device under test and a device output signal output from the device under test;

a signal generating section that generates the device input signal to be supplied to the device under test based on the input event including the change timing and the signal value after the change for the device input signal, which are included in the event data;

a signal supplying section that supplies the generated device input signal to the device under test;

a converting section that inputs the device output signal output from the device under test and converts the device output signal into the output event including the change timing and the signal value after the change for the device output signal;

a selecting section that outputs the previously selected output event between the output event converted by said converting section and the output event input from an outside; and a quality deciding section that checks, in parallel with the signal supply to the device under test, an event, which includes the change timing and the signal value after the change for the device output signal to be output from the device under test, as an expected value event with the output event output from said selecting section, in order to decide whether the device output signal is identical with the expected value or not, and the added apparatus being added between the device under test and the test apparatus when an interval to which the device output signal is changed is smaller than an interval capable of being processed by the test apparatus, the added apparatus comprising:

a signal input section that inputs the device output signal output from the device under test according to the device input signal;

a change detecting section that detects whether the input device output signal has been changed or not;

a change timing detecting section that detects the change timing for the device output signal;

a storing section that sequentially stores the change timing and the signal value after the change for the device output signal as an output event, according to the fact that the device output signal has been changed; and a reading section that sequentially reads the output events from said storing section to input the events into said test apparatus.

11. A test method for testing a device under test by means of a test system, comprising:

an event data acquiring step of acquiring event data including a plurality of sets of a change timing and a signal value after the change for each of a device input signal input into the device under test and a device output signal output from the device under test, which are obtained by a logic simulation for the device under test;

a signal generating step of generating the device input signal to be supplied to the device under test based on the input event including the change timing and the signal value after the change for the device input signal, which are included in the event data;

a signal supplying step of supplying the generated device input signal to the device under test;

a signal input step of inputting the device output signal output from the device under test according to the device input signal;

a change detecting step of detecting whether the input device output signal has been changed or not;

a change timing detecting step of detecting the change timing for the device output signal;

a storing step of sequentially storing the change timing and the signal value after the change for the device output signal as an output event, according to the fact that the device output signal has been changed;

a reading step of sequentially reading the output event stored in said storing step; and a quality deciding step of checking an event, which includes the change timing and the signal value after the change for the device output signal to be output from the device under test and is obtained by a logic simulation for the device under test, as an expected value event with the read output event, in order to decide whether the device output signal is identical with the expected value or not.

* * * * *